(12) United States Patent
Leung

(10) Patent No.: US 9,182,440 B1
(45) Date of Patent: Nov. 10, 2015

(54) PRESSURE ACTIVATED HIGH DENSITY SWITCH ARRAY

(71) Applicant: Marvell International Ltd., Hamilton (BM)

(72) Inventor: Yat Fai Leung, Granite Bay, CA (US)

(73) Assignee: Marvell International Ltd., Hamilton (BM)

( * ) Notice: Subject to any disclaimer, the term of this patent is extended or adjusted under 35 U.S.C. 154(b) by 472 days.

(21) Appl. No.: 13/747,800

(22) Filed: Jan. 23, 2013

Related U.S. Application Data

(60) Provisional application No. 61/592,134, filed on Jan. 30, 2012.

(51) Int. Cl.
  *G01R 31/28* (2006.01)
  *G01R 31/04* (2006.01)
  *G01R 3/00* (2006.01)
  *G01R 1/067* (2006.01)

(52) U.S. Cl.
  CPC *G01R 31/04* (2013.01); *G01R 3/00* (2013.01); *G01R 1/06716* (2013.01); *G01R 31/2889* (2013.01)

(58) Field of Classification Search
  CPC ........... G01R 1/07314; G01R 1/06716; G01R 1/06722; G01R 1/06788; G01R 1/0483; G01R 1/0466; G01R 1/0433; G01R 1/07328; G01R 31/31924; G01R 31/2889; G01R 31/2891; G01R 31/2886; G01R 31/31922; G01R 31/31937; G01R 31/2887; G01R 3/00; G01R 35/00; G11C 29/1201
  USPC ................. 324/415, 418, 422, 750.24, 750.3, 324/754.07, 754.08, 754.11, 754.12, 324/754.14, 755.05, 756.07, 750.01, 324/750.16, 754.01
  See application file for complete search history.

(56) References Cited

U.S. PATENT DOCUMENTS

| 4,045,735 | A | * | 8/1977 | Worcester et al. | ............. 324/537 |
| 5,177,437 | A | * | 1/1993 | Henley | ...................... 324/754.24 |
| 5,502,397 | A | * | 3/1996 | Buchanan | ................ 324/756.05 |

(Continued)

FOREIGN PATENT DOCUMENTS

WO    WO 2007006501 A1 *  1/2007

OTHER PUBLICATIONS

Hess et al., High Density Test Structure Array for Accurate Detection and Localization of Soft Fails, IEEE Conference on Microelectronic Test Structures, Mar. 24-27, 2008.*

(Continued)

*Primary Examiner* — Patrick Assouad
*Assistant Examiner* — Sean Curtis

(57) ABSTRACT

Some of the embodiments of the present disclosure provide a method for operating a testing system to test a device, wherein the testing system comprises a pressing module, the method comprising attaching the device to the pressing module of the testing system; while the testing system operates in a first mode of testing, pressing the pressing module to a first position such that (i) the device is electrically coupled to a first component via a first pin, and (ii) the device is electrically isolated from a second component via a second pin; and while the testing system operates in a second mode of testing, pressing the pressing module to a second position such that (i) the device is electrically isolated from first component via the first pin, and (ii) the device is electrically coupled to the second component via the second pin.

20 Claims, 5 Drawing Sheets

(56) References Cited

U.S. PATENT DOCUMENTS

| | | | |
|---|---|---|---|
| 5,734,270 A * | 3/1998 | Buchanan | 324/754.07 |
| 6,087,843 A * | 7/2000 | Pun et al. | 324/762.02 |
| 6,140,830 A * | 10/2000 | Ott | 324/755.05 |
| 6,559,665 B1 * | 5/2003 | Barabi | 324/754.08 |
| 6,700,396 B1 * | 3/2004 | Smith et al. | 324/750.09 |
| 6,794,887 B1 * | 9/2004 | Nelson et al. | 324/754.07 |
| 6,903,562 B1 * | 6/2005 | Smith et al. | 324/754.09 |
| 6,937,040 B2 * | 8/2005 | Maeda et al. | 324/754.07 |
| 6,957,005 B2 * | 10/2005 | Saulnier et al. | 385/137 |
| 7,327,153 B2 * | 2/2008 | Weinraub | 324/756.01 |
| 7,348,791 B1 * | 3/2008 | Mayder | 324/762.02 |
| 7,795,879 B2 * | 9/2010 | Watanabe | 324/537 |
| 7,876,120 B2 * | 1/2011 | Awaji et al. | 324/750.3 |
| 7,902,852 B1 * | 3/2011 | Hess et al. | 324/762.09 |
| 7,924,035 B2 * | 4/2011 | Huebner | 324/754.01 |
| 8,400,176 B2 * | 3/2013 | Arkin et al. | 324/756.03 |
| 8,493,085 B2 * | 7/2013 | Barabi et al. | 324/754.11 |
| 8,547,124 B2 * | 10/2013 | Kawahara et al. | 324/750.1 |
| 8,901,951 B1 * | 12/2014 | Hess et al. | 324/762.01 |
| 8,988,089 B2 * | 3/2015 | Kawahara et al. | 324/754.07 |
| 9,007,082 B2 * | 4/2015 | Nelson et al. | 324/750.24 |
| 2010/0013503 A1 * | 1/2010 | Huebner | 324/754 |
| 2010/0231251 A1 * | 9/2010 | Nelson et al. | 324/761 |
| 2011/0043233 A1 * | 2/2011 | Arkin et al. | 324/755.03 |
| 2011/0291682 A1 * | 12/2011 | Kawahara et al. | 324/754.07 |
| 2012/0019272 A1 * | 1/2012 | Kawahara et al. | 324/750.01 |
| 2012/0062261 A1 * | 3/2012 | Nelson et al. | 324/755.09 |
| 2013/0002285 A1 * | 1/2013 | Nelson et al. | 324/755.09 |

OTHER PUBLICATIONS

Barber et al., A Bare-Chip Probe for High I/O, High Speed Testing., Hewlett Packard, 1994.*

Walkdeck et al., A Next Generation ATE Switching Solution, Rockwell Collins, IEEE, 2014.*

* cited by examiner

US 9,182,440 B1

PRESSURE ACTIVATED HIGH DENSITY SWITCH ARRAY

CROSS REFERENCE TO RELATED APPLICATIONS

The present disclosure claims priority to U.S. Provisional Patent Application No. 61/592,134, filed on Jan. 30, 2012, which is incorporated herein by reference.

TECHNICAL FIELD

Embodiments of the present disclosure relate to switch arrays, and more particularly, to high density switch arrays.

BACKGROUND

In various computing systems, a device may need to be coupled to a first component during a first time period, and to be coupled to a second component during a second time period. For example, during a first mode of testing a device, the device has to be coupled to a test engine. During a second mode of testing the device, the device has to be coupled to a memory (or to another test engine). An electro-mechanical relay can be used to selectively couple the device to either the test engine or the memory, based on the mode of the test. In a typical test environment, a large number of electro-mechanical relays can be used. However, such electro-mechanical relays usually consume large amount of space, and generally cannot be densely arranged in a test environment.

SUMMARY

In various embodiments, the present disclosure provides a method for operating a testing system to test a device, wherein the testing system comprises a pressing module, the method comprising attaching the device to the pressing module of the testing system; while the testing system operates in a first mode of testing, pressing the pressing module to a first position such that (i) the device is electrically coupled to a first component via a first pin, and (ii) the device is electrically isolated from a second component via a second pin; and while the testing system operates in a second mode of testing, pressing the pressing module to a second position such that (i) the device is electrically isolated from first component via the first pin, and (ii) the device is electrically coupled to the second component via the second pin.

There is also provided, in various embodiments, a testing system configured to test a device, the testing system comprising a pressing module, wherein the device is attached to the pressing module while the device is being tested; a first pin; and a second pin, wherein while the testing system operates in a first mode of testing, the pressing module is configured to be pressed to a first position such that (i) the device is electrically coupled to a first component via the first pin, and (ii) the device is electrically isolated from a second component via the second pin, and wherein while the testing system operates in a second mode of testing, the pressing module is configured to be pressed to a second position such that (i) the device is electrically isolated from first component via the first pin, and (ii) the device is electrically coupled to the second component via the second pin.

Potential advantages of one or more of the embodiments disclosed herein include using various spring loaded pins to selectively couple a device under test to a first component or to a second component. Such spring loaded pins consume relatively less space (e.g., can be densely arranged, and may also consume less power and result in less heat dissipation), compared to conventional electro-magnetic relays. Thus, the system disclosed herein is more space efficient (and more power efficient) compared to conventional testing systems using electro-magnetic relays.

BRIEF DESCRIPTION OF THE DRAWINGS

Like reference symbols in the various drawings indicate like elements.

DETAILED DESCRIPTION

Figure 1:
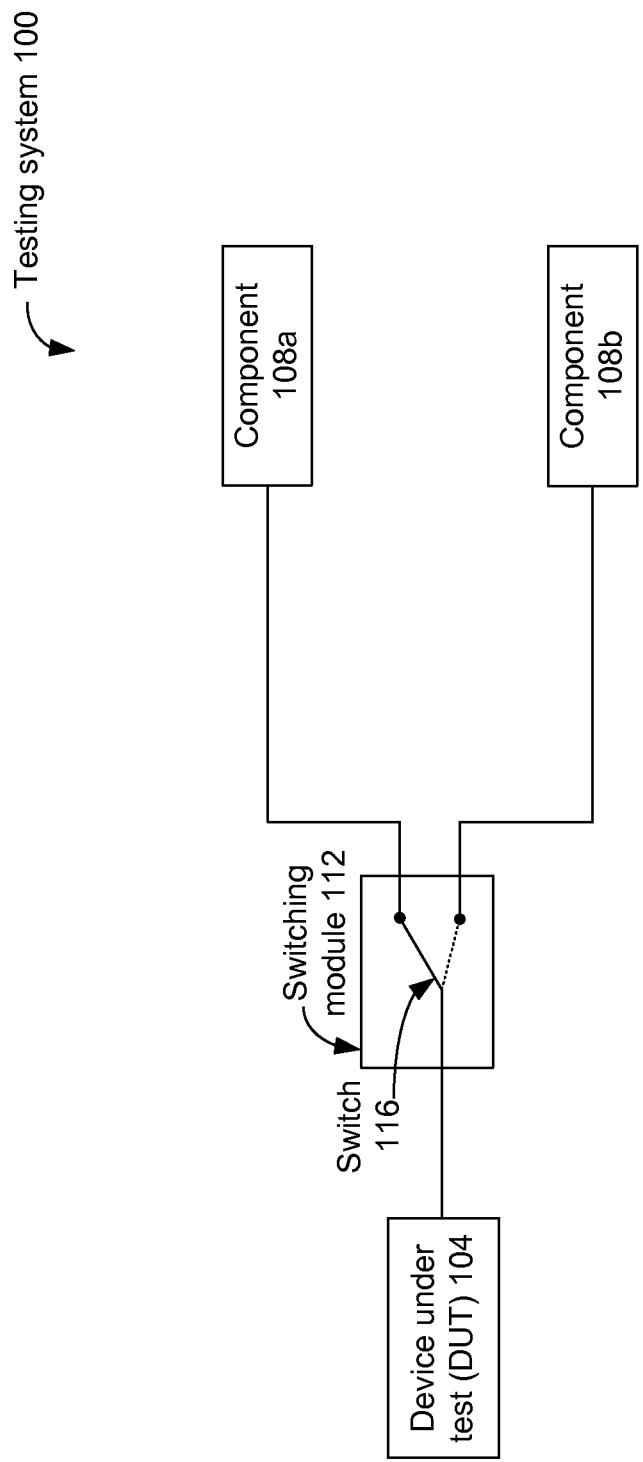
FIG. 1 schematically illustrates a testing system configured to test a device under test (DUT).

FIG. 1 schematically illustrates an embodiment of a testing system 100 (referred to herein as "system 100") configured to test a device under test (DUT) 104. The DUT 104 may be any appropriate device that is to be tested, e.g., a processing core, a System of a Chip (SoC), a memory device, an integrated circuit, and/or the like.

The DUT 104 is coupled to a switching module 112. The switching module 112 comprises a switch 116. In an embodiment, the switching module 112 is configured to selectively couple the DUT 104 to a component 108a or to a component 108b included in the system 100. In an embodiment, the testing of the DUT 104 comprises at least two modes of testing. For example, the DUT 104 is coupled, via the switching module 112, to the component 108a during a first mode of testing the DUT 104. In another example, the DUT 104 is coupled, via the switching module 112, to the component 108b during a second mode of testing the DUT 104.

The components 108a and 108b comprises any appropriate components associated with testing the DUT 104. Merely as an example, the component 108a is a test engine or a testing apparatus configured to test the DUT 104, and the component 108b is a memory device configured to store test results or other information associated with the DUT 104 (although the components 108a and 108b can be any other appropriate components associated with the system 100). For example, during the first mode of testing, the test engine tests the DUT 104; and during the second mode of testing, the DUT 104 stores test data and/or other information to the memory device. In another example, the component 108a is a first test engine or a first testing apparatus configured to perform a first test on the DUT 104, and the component 108b is a second test engine or a second testing apparatus configured to perform a second test on the DUT 104.

Figure 2A:
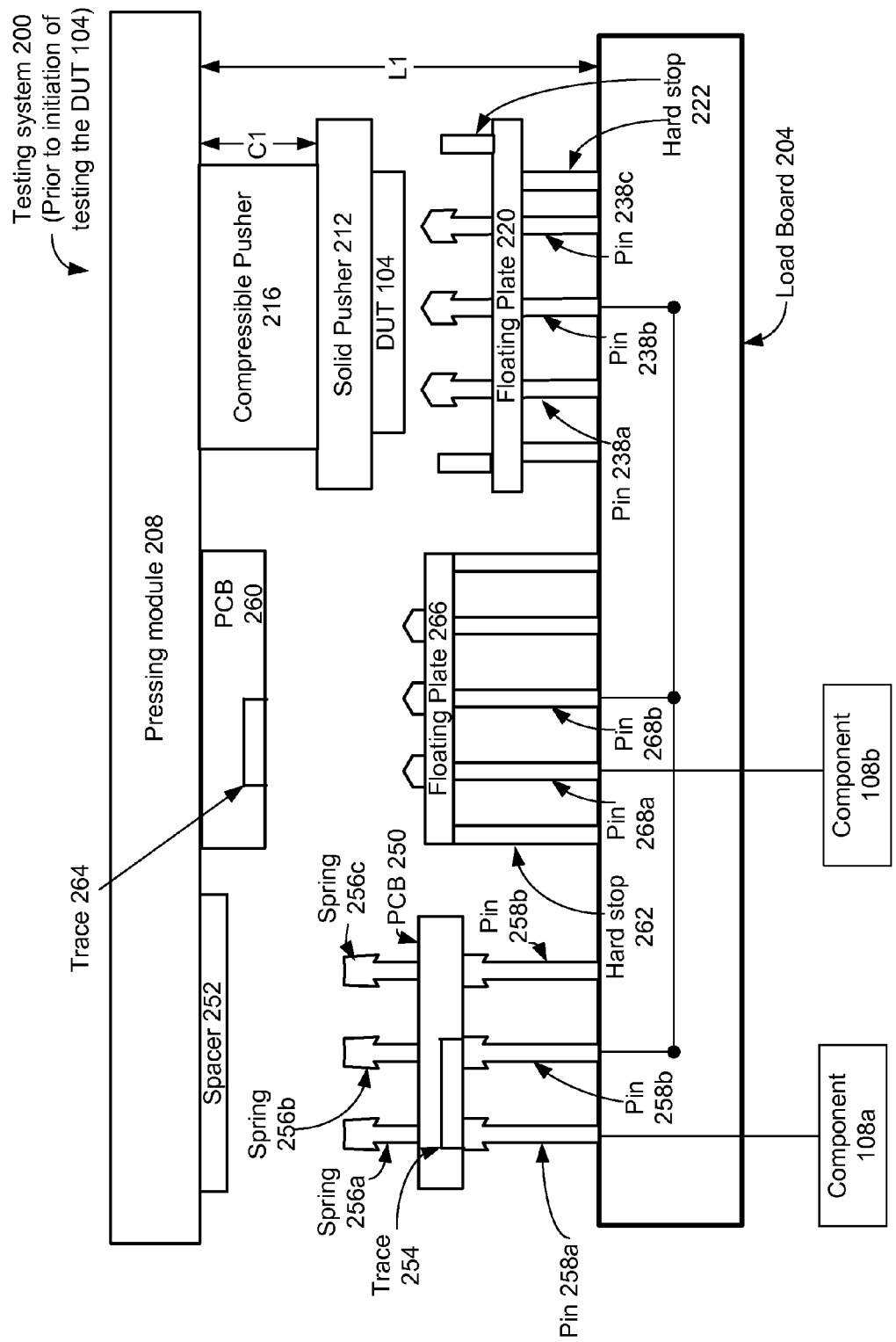
FIGS. 2A-2C schematically illustrate a testing system operating in various testing modes.
Figure 2B:
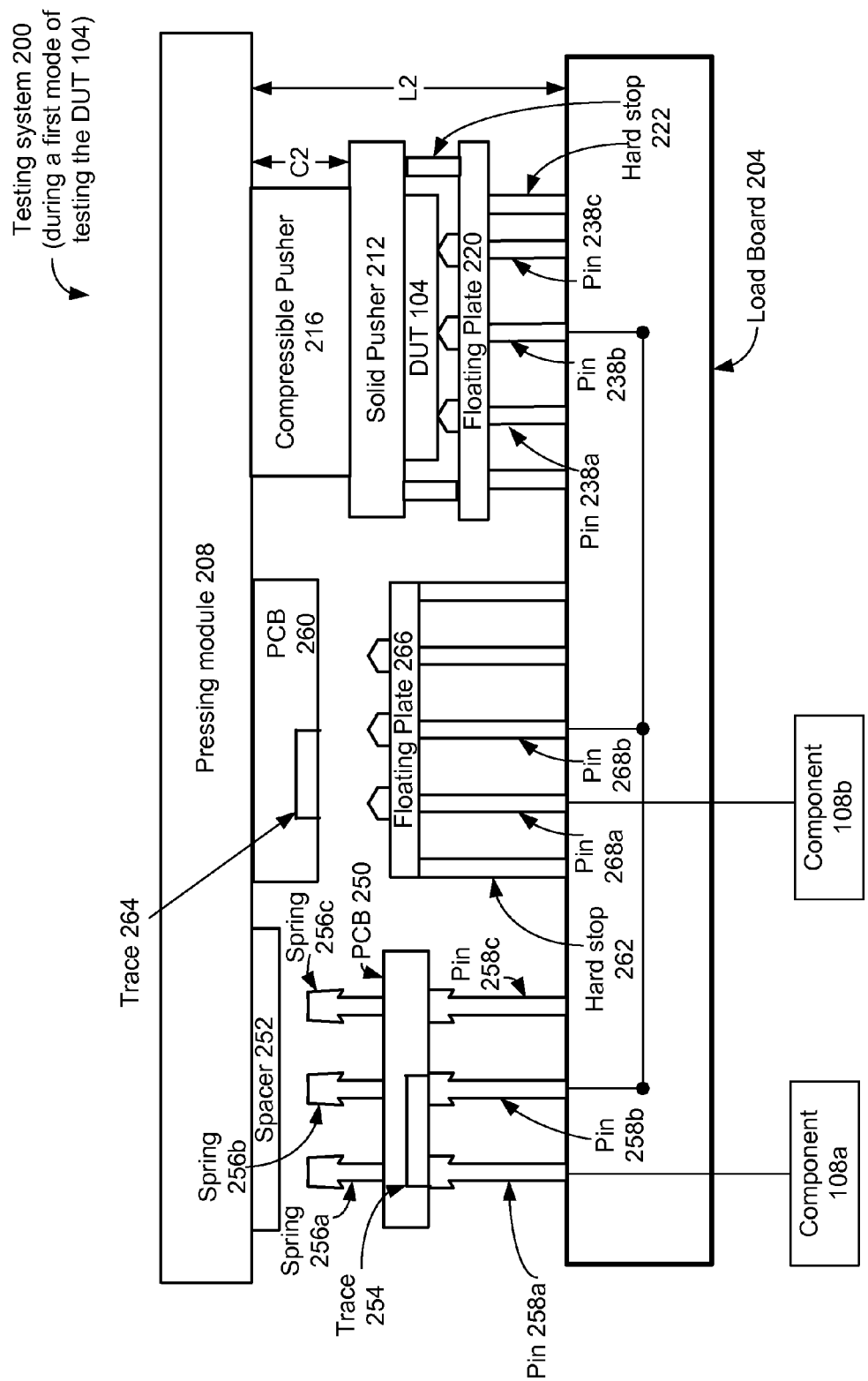
Figure 2C:
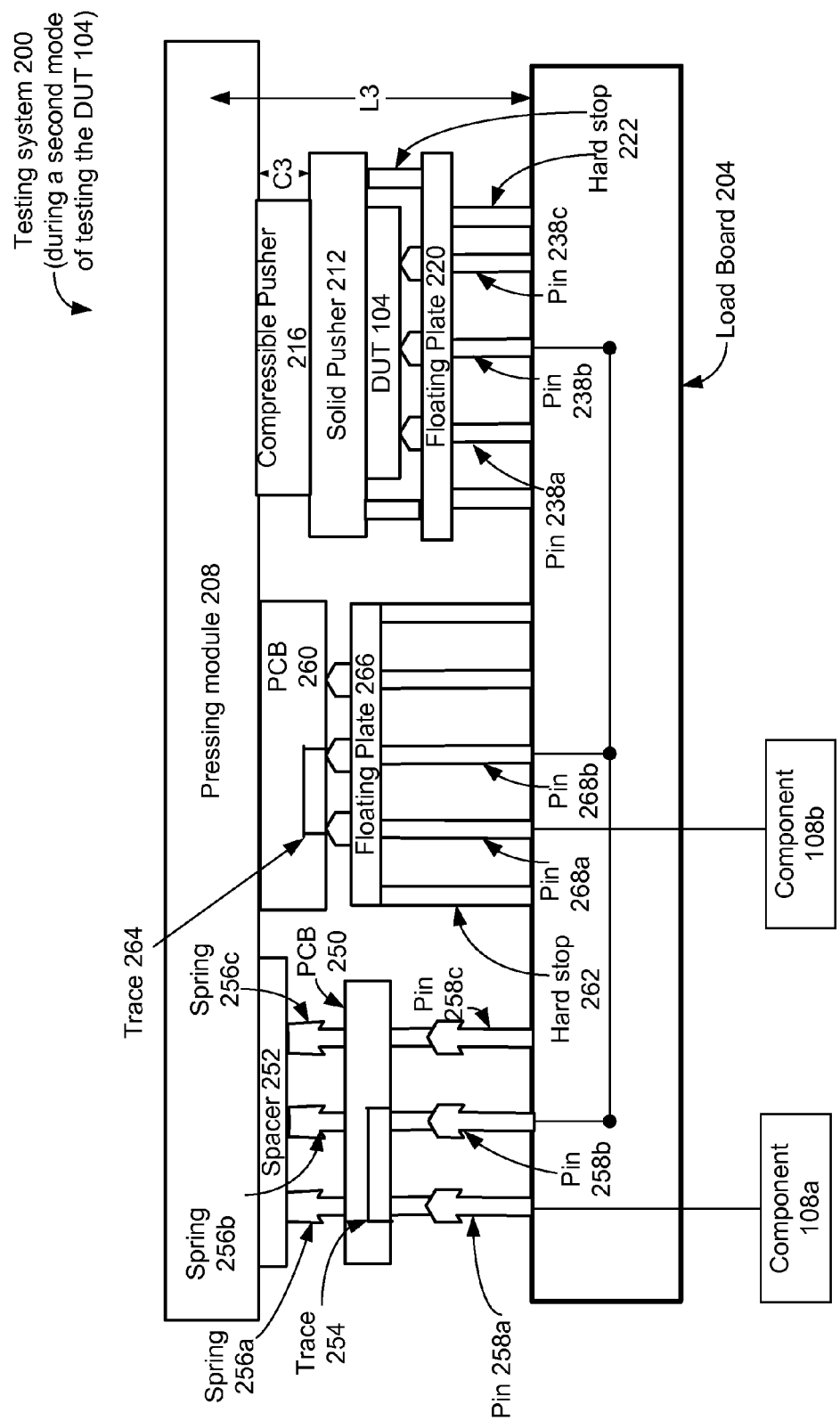

FIGS. 2A-2C schematically illustrate an embodiment of a testing system 200 (referred to herein as "system 200") operating in various testing modes. The system 200 illustrates an example implementation of the switching module 112 of FIG. 1. The system 200 comprises the DUT 104 selectively coupled to the component 108a or the component 108b, based on the mode of testing of the system 200. In an embodiment, one or both the components 108a and 108b are included in the system 200, while in another embodiment, one or both the components 108a and 108b are external to the system 200.

As discussed in more detail herein later, FIG. 2A corresponds to the system 200 prior to an initiation of testing the DUT 104. FIG. 2B corresponds to the first mode of testing, when the DUT 104 is (i) electrically coupled to the component 108a and (ii) electrically isolated from the component 108*b*. FIG. 2C corresponds to the second mode of testing, when the DUT 104 is (i) electrically coupled to the component 108*b* and (ii) electrically isolated from the component 108*a*.

The system 200 comprises a pressing module 208 and a load board 204. The load board 204, for example, is a printed circuit board (PCB). The pressing module 208 is selectively pressed (e.g., using a work press or the like) towards the load board 204 during various modes of testing the DUT 104.

For example, prior to initiation of testing the DUT 104, the pressing module 208 is at a distance L1 from the load board 204, as illustrated in FIG. 2A. This position of the pressing module 208 (i.e., at the distance L1 from the load board 204) represents a nominal or a neutral position of the pressing module 208 (i.e., at this position, the pressing module 208 is not pressed towards the load board 204).

During the first mode of testing, the pressing module 208 is pressed towards the load board 204, such that the pressing module 208 is at a distance L2 from the load board, as illustrated in FIG. 2B. The distance L2 is, for example, less than the distance L1. As discussed, during the first mode of testing, the DUT 104 is electrically coupled to the component 108*a* (but electrically isolated from the component 108*b*).

During the second mode of testing, the pressing module 208 is pressed further towards the load board 204, such that the pressing module 208 is at a distance L3 from the load board, as illustrated in FIG. 2C. The distance L3 is, for example, less than each of the distances L1 and L2. As discussed, during the second mode of testing, the DUT 104 is electrically coupled to the component 108*b* (but electrically isolated from the component 108*a*).

In an embodiment, the system 200 comprises (i) a compressible pusher 216 that is mechanically attached to the pressing module 208, and (ii) a solid pusher that 212 is mechanically attached to the compressible pusher 216, as illustrated in FIG. 2A. During testing of the DUT 104, the DUT 104 is attached to the solid pusher 212.

A plurality of pins 238*a*, 238*b*, 238*c* are attached to the load board 204, and positioned below the DUT 104. A floating plate 220, for example, supports and holds the pins 238*a*, 238*b*, 238*c* in position (e.g., the pins 238*a*, 238*b*, 238*c* are inserted through respective holes in the floating plate 220, and the floating plate 220 is a mechanical arrangement to support the pins 238*a*, 238*b*, 238*c* in their respective vertical positions). In an embodiment and although not illustrated in the figures, the floating plate 220 is not present in the system 200.

In an embodiment, the pins 238*a*, 238*b*, 238*c* are spring loaded pins or pressure activated pins. For example, the pins 238*a*, 238*b*, 238*c* are Pogo® pins. When pressure is applied to the pins 238*a*, 238*b*, 238*c*, the pins 238*a*, 238*b*, 238*c* make electrical contact (e.g., are switched on, or are in a conductive state). For example, as illustrated in FIGS. 2B and 2C, when the pressing module 208 is pressed towards the load board 204, the DUT 104 applies pressure on the pins 238*a*, 238*b*, 238*c*. Based on the application of the pressure, the pins 238*a*, 238*b*, 238*c* are electrically coupled to respective contacts (e.g., respective input/output pins) of the DUT 104.

The system 200 further comprises a plurality of hard stops 222, only some of which are labeled in FIGS. 2A-2C. The hard stops 222, for example, are mechanical supports that limit an amount by which the DUT 104 can be pressed downwards towards the load board 204. That is, the hard stops 222 prevents the DUT 104 from being pressed towards the load board 204 beyond a certain limit (e.g., while the pressing module 208 is being pressed towards the load board 204), thereby preventing any damage to the pins 238*a*, 238*b*, 238*c*.

In an embodiment, the compressible pusher 216 selectively compresses (e.g., a width of the compressible pusher 216 changes) as the pressing module 208 is pressed towards the load board 204, to prevent undue pressure forming on the DUT 104 and/or the pins 238*a*, 238*b*, 238*c*. For example, the width of the compressible pusher 216 is C1 prior to the initiation of the test (i.e., while no pressure is applied via the pressing module 208 of the DUT 104), as illustrated in FIG. 2A. The width of the compressible pusher 216 is reduced to C2 during the first mode of testing the DUT 104 (i.e., while the pressing module 208 is at the distance L2 from the load board 204), as illustrated in FIG. 2B. The width of the compressible pusher 216 is further reduced to C3 during the second mode of testing the DUT 104 (i.e., while the pressing module 208 is at the distance L3 from the load board 204), as illustrated in FIG. 2C.

The system 200 also comprises a PCB 260 attached to the pressing module 208. The PCB 260 comprises, among other features, a trace 264 coupled between two input/output contacts (not illustrated in FIGS. 2A-2C) of the PCB 260. The system 200 further comprises pins 268*a* and 268*b* that are directly beneath the two input/output contacts associated with the trace 264, as illustrated in FIGS. 2A-2C.

In an embodiment, the pin 268*a* is electrically coupled to the component 108*b*, e.g., through the load board 204 (e.g., through a trace in the load board 204). In an embodiment, the pin 268*b* is electrically coupled to the pin 238*b*, e.g., through the load board 204 (e.g., through a trace in the load board 204).

In an embodiment, the pins 268*a* and 268*b* are spring loaded pins or pressure activated pins. For example, the pins 268*a* and 268*b* are Pogo® pins. When pressure is applied to the pins 268*a* and 268*b*, the pins 268*a* and 268*b* make electrical contact.

For example, while the pressing module 208 is at distances L1 and L2 from the load board 204 (e.g., as illustrated in FIGS. 2A and 2B), the pins 268*a* and 268*b* are not in physical or electrical contact with the PCB 260 (e.g., with the trace 264). However, when the pressing module 208 is pressed further downwards towards the load board 204 (e.g., when the pressing module 208 is at the distance L3 from the load board 204), a respective end of the pins 268*a* and 268*b* makes contact with the input/output contacts of the PCB 260. While the pressing module 208 is at the distance L3 from the load board 204, due to the pressure exerted by the PCB 260 on the pressure activated pins 268*a* and 268*b* (e.g., due to the pressing of the pressing module 208 towards the load board 204), the pins 268*a* and 268*b* are switched on. Accordingly, the trace 264 electrically couples the pins 268*a* and 268*b*, as illustrated in FIG. 2C.

In an embodiment, a floating plate 266, for example, supports and holds the pins 268*a* and 268*b* in position (e.g., the pins 268*a* and 268*b* are inserted through respective holes in the floating plate 266, and the floating plate 266 is a mechanical arrangement to support the pins 268*a* and 268*b* in their respective vertical positions). In another embodiment and although not illustrated in the figures, the floating plate 266 is not present in the system 200. The system 200 further comprises hard stops 262, only one of which is labeled in FIGS. 2A-2C. The hard stops 262, for example, are mechanical supports that limit an amount by which the PCB 260 can be pressed downwards towards the load board 204. That is, the hard stops 262 prevents the PCB 260 from being pressed towards the load board 204 beyond a certain limit (e.g., stops the PCB 260 from pressing the floating plate 266 downwards towards the load board 204), thereby preventing any damage to the pins 268*a* and 268*b*.

Prior to initiation of the testing of the DUT 104 (e.g., while the pressing module is at the distance L1 from the load board 204), the DUT 104 is not in electrical contact with the pin 238b, as illustrated in FIG. 2A. Accordingly, at this time, the DUT 104 is electrically isolated from the pin 268b, the trace 264, the pin 268a, and the component 108b.

During the first mode of testing the DUT 104 (e.g., while the pressing module is at the distance L2 from the load board 204), the DUT 104 is in electrical contact with the pin 238b, as illustrated in FIG. 2B and as previously discussed. At this time, the DUT 104 is also in electrical contact with the pin 268b (e.g., via the pin 238b and the trace in the load board 204). However, during this time, the pin 268b is electrically isolated from the trace 264, as illustrated in FIG. 2B. Accordingly, during this time, the DUT 104 is also electrically isolated from the trace 264, the pin 268a, and the component 108b.

During the second mode of testing the DUT 104 (e.g., while the pressing module is at the distance L3 from the load board 204), the DUT 104 is in electrical contact with the pin 238b, as illustrated in FIG. 2B and as previously discussed. At this time, the DUT 104 is also in electrical contact with the pin 268b (e.g., via the pin 238b and the trace in the load board 204). Also, during this time, the pin 268b is electrically coupled to the pin 268a, via the trace 264, as illustrated in FIG. 2C and as previously discussed. Accordingly, during this time, the DUT 104 is also electrically coupled to the trace 264, the pin 268a, and the component 108b.

Thus, put differently, the DUT 104 is electrically isolated from the component 108b prior to initiation of testing the DUT 104 and also during the first mode of testing the DUT 104; and the DUT 104 is electrically coupled to the component 108b during the second mode of testing the DUT 104.

The system 200 also comprises a PCB 250 attached to the load board 204 via a plurality of pins 258a, 258b, 258c. The PCB 250 comprises, among other features, a trace 254 coupled between two input/output contacts (not illustrated in FIGS. 2A-2C) of the PCB 250. The pins 258a and 258b are directly beneath the two input/output contacts associated with the trace 254, as illustrated in FIGS. 2A-2C. The PCB 250 is also coupled to, for example, a plurality of springs 256a, 256b, 256c. In an embodiment, the PCB 250 has a first surface, and a second surface that is opposite the first surface. The pins 258a, 258b, 258c are attached to the first surface of the PCB 250, while the springs 256a, 256b, 256c are attached to the second surface of the PCB 250.

In an embodiment, each of the springs 256a, 256b, 256c are part of, or attached to, a corresponding pin of the pins 258a, 258b, 258c. For example, the spring 256a is a part of, or attached to, the pin 258a, and these two components are mechanically coupled through a hole (not illustrated in the figures) in the PCB 250. In such an embodiment, the trace 254 is coupled to an outer ring of the pin 258a and to an outer ring of the pin 258b.

In an embodiment, the springs 256a, 256b, 256c are arranged beneath a spacer 252 attached to the pressing module 208. In another embodiment and although not illustrated in FIGS. 2A-2C, the spacer 252 is absent from the system 200 (e.g., in such an embodiment, the sprigs 256a, 256b, 256c make direct contact with the pressing module 208 while the pressing module 208 is at the distance L3 from the load board 204).

In an embodiment, the pin 258b is coupled, via a trace in the load board 204, to the pin 238b associated with the DUT 104. In an embodiment, the pin 258a is coupled, via a trace in the load board 204, to the component 108a.

In an embodiment, the pins 258a and 258b are spring loaded pins or pressure activated pins. For example, the pins 258a and 258b are Pogo® pins. When no pressure is applied to the pins 258a and 258b (e.g., via the springs 256a and 256b), each of the pins 258a and 258b makes electrical contact (e.g., are switched on, or are in a conductive state) with the trace 254. However, when pressure is applied to the pins 258a and 258b (e.g., via the springs 256a and 256b), each of the pins 258a and 258b breaks the electrical contact (e.g., are switched off, or are in a non-conductive state) with the trace 254.

For example, as illustrated in FIGS. 2A and 2B, when the pressing module 208 at distances L1 and L2 from the load board 204, the spacer 252 is not in physical contact (or does not apply pressure) on the springs 256a, 256b, 256c. Accordingly, no pressure is applied to the pins 258a and 258b, and hence, the pins 258a and 258b are in conductive state. For example, the pins 258a and 258b are in electrical contact with the trace 254. Accordingly, when the pressing module 208 at distances L1 and L2 from the load board 204 (i.e., prior to the initiation of the test, and during the first mode of the test), the DUT 104 is in electrical contact with the component 108a, via the pin 238b, the trace on the load board 204, the pin 258b, the trace 254 and the pin 258a.

However, as illustrated in FIG. 2C, when the pressing module 208 at the distance L3 from the load board 204, the spacer 252 is in physical contact (or applies pressure) on the springs 256a, 256b, 256c. Accordingly, the pressure is transmitted to the pins 258a and 258b, and hence, the pins 258a and 258b are in a non-conductive state. For example, a conductive head of the pins 258a and 258b are electrically isolated from the trace 254. Accordingly, when the pressing module 208 at the distance L3 from the load board 204 (i.e., during the second mode of the test), the DUT 104 is electrically isolated from the component 108a (e.g., due to the electrical isolation between the pins 258a and 258b with the trace 254).

Thus, put differently, during the first mode of testing the DUT 104, the DUT 104 is in electrical contact with the component 108a (and electrically isolated from the component 108b); and during the second mode of testing the DUT 104, the DUT 104 is electrically isolated from the component 108a (and electrically connected to the component 108b).

Although FIGS. 2A-2C illustrate a single pressing module 208, in an embodiment, more than one pressing module is used in the system 200. For example, a first pressing module is used to press the DUT 104 (e.g., via the compressible pusher 216 and the solid pusher 212); a second pressing module is used to press the PCB 260; and/or a third pressing module is used to press the spacer 252 towards the load board 204.

Figure 3:
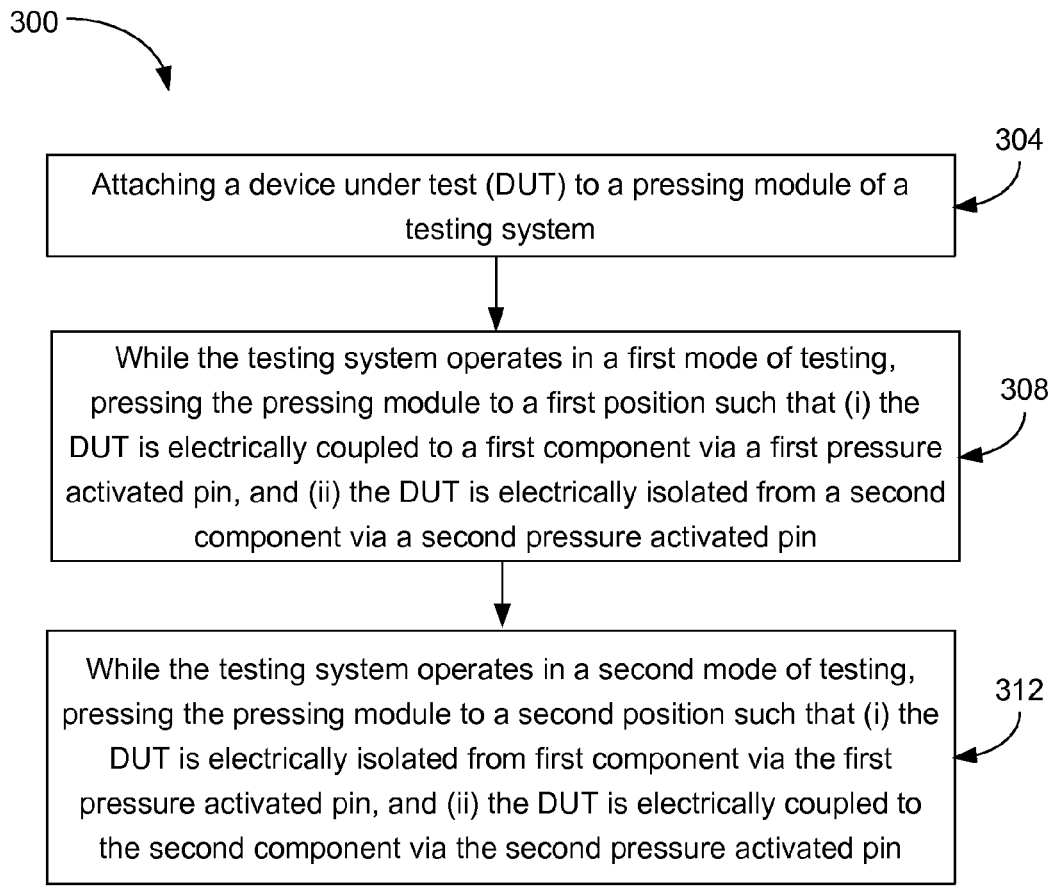
FIG. 3 illustrates an example method for operating a testing system.

FIG. 3 illustrates an example method 300 for operating a testing system (e.g., the testing system 200 of FIGS. 2A-2C). At 304 of the method 300, a device under test (DUT) is attached to a pressing module (e.g., the pressing module 208) of the testing system (e.g., via the compressible pusher 216 and the solid pusher that 212).

At 308, while the testing system operates in a first mode of testing, the pressing module is pressed to a first position (e.g., the pressing module is at the distance L2 from a load board of the testing module) such that (i) the DUT is electrically coupled to a first component (e.g., component 108a) via a first pressure activated pin (e.g., one of the pins 258a or 258b), and (ii) the DUT is electrically isolated from a second component (e.g., component 108b) via a second pressure activated pin (e.g., one of the pins 268a or 268b).

At 312, while the testing system operates in a second mode of testing, the pressing module is pressed to a second position (e.g., the pressing module is at the distance L3 from the load board) such that (i) the DUT is electrically isolated from first component via the first pressure activated pin, and (ii) the DUT is electrically coupled to the second component via the second pressure activated pin.

As previously discussed, a conventional testing system uses electro-magnetic relays to selectively coupled a DUT to a first component or to a second component, and such electro-magnetic relays usually consume large amount of space. In contrast, the system 200 uses various spring loaded pins to selectively coupled the DUT 104 to the component 108a or to the component 108b. Such spring loaded pins consume relatively less space (e.g., can be densely arranged, and may also consume less power and result in less heat dissipation), compared to the conventional electro-magnetic relays. Thus, the system 200 is more space efficient (and more power efficient) compared to a conventional testing system using electro-magnetic relays.

Various embodiments of this disclosure have been discussed with respect to a testing system, in which the DUT 104 is selectively coupled to the component 108a during the first test mode, and to the component 108b during the second test mode (e.g., by selectively pressing the pressing module 208 to different positions). However, the teachings of this disclosure can be applied to other areas as well (e.g., other than testing a device), in which any device needs to be selectively coupled to a first component during a first time period, and to a second component during a second time period, as will be readily understood by those skilled in the art based on the teachings of this disclosure. For example, the teachings of this disclosure can be used to construct high density switch arrays (e.g., for use in a testing system, or any other appropriate systems) using spring loaded pins, and selectively exerting pressure on individual pins to selectively make or break electrical contacts.

In accordance with various embodiments, an article of manufacture may be provided that includes a storage medium having instructions stored thereon that, if executed, result in at least some of the operations described herein with respect to the method 300 of FIG. 3 (and/or various other operations discussed in the present disclosure). In an embodiment, the storage medium comprises some type of non-transitory memory (not shown). In accordance with various embodiments, the article of manufacture may be a computer-readable medium such as, for example, software or firmware.

The description incorporates use of the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although specific embodiments have been illustrated and described herein, it is noted that a wide variety of alternate and/or equivalent implementations may be substituted for the specific embodiment shown and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. A method for operating a testing system to test a device, wherein the testing system comprises a pressing module, the method comprising:
   attaching the device to the pressing module of the testing system;
   while the testing system operates in a first mode of testing, pressing the pressing module to a first position such that (i) the device is electrically coupled to a first component via a first pin, and (ii) the device is electrically isolated from a second component via a second pin; and
   while the testing system operates in a second mode of testing, pressing the pressing module to a second position such that (i) the device is electrically isolated from first component via the first pin, and (ii) the device is electrically coupled to the second component via the second pin.

2. The method of claim 1, wherein:
   the first pin is attached to a load board;
   the second pin is attached to the load board;
   pressing the pressing module to the first position further comprises
      pressing the pressing module to the first position such that the pressing module is at a first distance from the load board;
   pressing the pressing module to the second position further comprises
      pressing the pressing module to the second position such that the pressing module is at a second distance from the load board; and
   the second distance is less than the first distance.

3. The method of claim 1, wherein while the testing system operates in the first mode of testing:
   the pressing module does not exert any pressure on each of (i) the first pin and (ii) a third pin; and
   based on the pressing module not exerting any pressure on each of (i) the first pin and (ii) the third pin, each of (i) the first pin and (ii) the third pin is electrically coupled to a first trace disposed on a first printed circuit board.

4. The method of claim 3, wherein while the testing system operates in the first mode of testing:
   the first pin is electrically coupled to the device via a second trace disposed on a second printed circuit board;
   the third pin is electrically coupled to the first component via a third trace disposed on the second printed circuit board; and
   based on each of (i) the first pin and (ii) the third pin being electrically coupled to the first trace disposed on the first printed circuit board, the device is electrically coupled to the first component via the second trace, the first pin, the first trace, the third pin, and the third trace.

5. The method of claim 3, wherein while the testing system operates in the second mode of testing:
   the pressing module exerts pressure on each of (i) the first pin and (ii) the third pin; and
   based on the pressing module exerting pressure on each of (i) the first pin and (ii) the third pin, each of (i) the first pin and (ii) the third pin is electrically isolated from the first trace disposed on the first printed circuit board.

6. The method of claim 5, wherein while the testing system operates in the second mode of testing:
based on each of (i) the first pin and (ii) the third pin being electrically isolated from the first trace disposed on the first printed circuit board, the device is electrically isolated from first component.

7. The method of claim 3, wherein while the testing system operates in the first mode of testing:
based on pressing the pressing module to the first position, each of (i) the second pin and (ii) a fourth pin is electrically isolated from a second trace disposed on a second printed circuit board; and
based on each of (i) the second pin and (ii) the fourth pin being electrically isolated from the second trace disposed on the second printed circuit board, the device is electrically isolated from the second component.

8. The method of claim 7, wherein while the testing system operates in the second mode of testing:
based on pressing the pressing module to the second position, the pressing module exerts pressure on each of (i) the second pin and (ii) the fourth pin;
based on the pressing module exerting pressure on each of (i) the second pin and (ii) the fourth pin, each of (i) the second pin and (ii) the fourth pin is electrically connected to the second trace disposed on the second printed circuit board; and
based on each of (i) the second pin and (ii) the fourth pin being electrically connected to the second trace disposed on the second printed circuit board, the device is electrically coupled to the second component.

9. The method of claim 7, wherein:
the second pin is electrically coupled to the device via a third trace disposed on a third printed circuit board; and
the fourth pin is electrically coupled to the second component via a fourth trace disposed on the third printed circuit board.

10. The method of claim 1, wherein:
attaching the device to the pressing module further comprises
attaching the device to the pressing module via a compressible pusher;
pressing the pressing module to the first position further comprises
pressing the pressing module to the first position such that the compressible pusher is compressed to a first width; and
pressing the pressing module to the second position further comprises
pressing the pressing module to the second position such that the compressible pusher is compressed to a second width that is less than the first width.

11. A testing system configured to test a device, the testing system comprising:
a pressing module, wherein the device is attached to the pressing module while the device is being tested;
a first pin; and
a second pin,
wherein while the testing system operates in a first mode of testing, the pressing module is configured to be pressed to a first position such that (i) the device is electrically coupled to a first component via the first pin, and (ii) the device is electrically isolated from a second component via the second pin, and
wherein while the testing system operates in a second mode of testing, the pressing module is configured to be pressed to a second position such that (i) the device is electrically isolated from first component via the first pin, and (ii) the device is electrically coupled to the second component via the second pin.

12. The testing system of claim 11, wherein:
the testing system further comprises a load board;
the first pin is attached to the load board;
the second pin is attached to the load board;
while the pressing module is pressed to the first position, the pressing module is at a first distance from the load board; and
while the pressing module is pressed to the second position, the pressing module is at a second distance from the load board, such that the second distance is less than the first distance.

13. The testing system of claim 11, wherein while the testing system operates in the first mode of testing:
the pressing module does not exert any pressure on each of (i) the first pin and (ii) a third pin of the testing system; and
based on the pressing module not exerting any pressure on each of (i) the first pin and (ii) the third pin, each of (i) the first pin and (ii) the third pin is electrically coupled to a first trace disposed on a first printed circuit board of the testing system.

14. The testing system of claim 13, wherein while the testing system operates in the first mode of testing:
the first pin is electrically coupled to the device via a second trace disposed on a second printed circuit board of the testing system;
the third pin is electrically coupled to the first component via a third trace disposed on the second printed circuit board; and
based on each of (i) the first pin and (ii) the third pin being electrically coupled to the first trace disposed on the first printed circuit board, the device is electrically coupled to the first component via the second trace, the first pin, the first trace, the third pin, and the third trace.

15. The testing system of claim 13, wherein while the testing system operates in the second mode of testing:
the pressing module exerts pressure on each of (i) the first pin and (ii) the third pin; and
based on the pressing module exerting pressure on each of (i) the first pin and (ii) the third pin, each of (i) the first pin and (ii) the third pin is electrically isolated from the first trace disposed on the first printed circuit board.

16. The testing system of claim 15, wherein while the testing system operates in the second mode of testing:
based on each of (i) the first pin and (ii) the third pin being electrically isolated from the first trace disposed on the first printed circuit board, the device is electrically isolated from first component via the first pin.

17. The testing system of claim 13, wherein while the testing system operates in the first mode of testing:
based on pressing the pressing module to the first position, each of (i) the second pin and (ii) a fourth pin of the testing system is electrically isolated from a second trace disposed on a second printed circuit board of the testing system; and
based on each of (i) the second pin and (ii) the fourth pin being electrically isolated from the second trace disposed on the second printed circuit board, the device is electrically isolated from the second component.

18. The testing system of claim 17, wherein while the testing system operates in the second mode of testing:

based on pressing the pressing module to the second position, the pressing module exerts pressure on each of (i) the second pin and (ii) the fourth pin;

based on the pressing module exerting pressure on each of (i) the second pin and (ii) the fourth pin, each of (i) the second pin and (ii) the fourth pin is electrically connected to the second trace disposed on the second printed circuit board; and based on each of (i) the second pin and (ii) the fourth pin being electrically connected to the second trace disposed on the second printed circuit board, the device is electrically coupled to the second component.

19. The testing system of claim 17, wherein:

the second pin is electrically coupled to the device via a third trace disposed on a third printed circuit board of the testing system; and the fourth pin is electrically coupled to the second component via a fourth trace disposed on the third printed circuit board.

20. The testing system of claim 11, further comprising:

a compressible pusher, wherein the device is attached to the pressing module via the compressible pusher, wherein while the pressing module is pressed to the first position, the compressible pusher is compressed to a first width, and while the pressing module is pressed to the second position, the compressible pusher is compressed to a second width that is less than the first width.

\* \* \* \* \*